(12) United States Patent
Chen et al.

(10) Patent No.: US 9,773,889 B2
(45) Date of Patent: Sep. 26, 2017

(54) METHOD OF SEMICONDUCTOR ARRANGEMENT FORMATION

(71) Applicant: Taiwan Semiconductor Manufacturing Company Limited, Hsin-Chu (TW)

(72) Inventors: Wei-Chieh Chen, Taichung (TW); Hao-Hsiung Lin, Taipei (TW); Shu-Han Chen, Hsinchu (TW); You-Ru Lin, New Taipei (TW); Cheng-Hsien Wu, Hsinchu (TW); Chih-Hsin Ko, Fongshan (TW); Clement Hsingjen Wann, Carmel, NY (US)

(73) Assignee: Taiwan Semiconductor Manufacturing Company Limited (TW)

( * ) Notice: Subject to any disclaimer, the term of this patent is extended or adjusted under 35 U.S.C. 154(b) by 391 days.

(21) Appl. No.: 14/334,827

(22) Filed: Jul. 18, 2014

(65) Prior Publication Data

US 2016/0020302 A1   Jan. 21, 2016

(51) Int. Cl.
*H01L 21/36* (2006.01)
*H01L 29/06* (2006.01)
(Continued)

(52) U.S. Cl.
CPC .. *H01L 29/66666* (2013.01); *H01L 21/02587* (2013.01); *H01L 21/02609* (2013.01);
(Continued)

(58) Field of Classification Search
CPC ......... H01L 21/02609; H01L 21/02631; H01L 21/02639; H01L 21/02587; H01L 29/0649;
(Continued)

(56) References Cited

U.S. PATENT DOCUMENTS 3,755,704 A * 8/1973 Spindt ................... H01J 1/3042
                                                               313/309
4,810,473 A * 3/1989 Tamura .................. C30B 23/02
                                                               118/500
(Continued)

OTHER PUBLICATIONS

Corresponding Korean Application, Korean Application 10-2014-0195369, dated Jan. 20, 2016, 8 pages.
(Continued)

*Primary Examiner* — Mary Wilczewski
(74) *Attorney, Agent, or Firm* — Cooper Legal Group LLC

(57) ABSTRACT

Methods of semiconductor arrangement formation are provided. A method of forming the semiconductor arrangement includes forming a first nucleus on a substrate in a trench or between dielectric pillars on the substrate. Forming the first nucleus includes applying a first source material beam at a first angle relative to a top surface of the substrate and concurrently applying a second source material beam at a second angle relative to the top surface of the substrate. A first semiconductor column is formed from the first nucleus by rotating the substrate while applying the first source material beam and the second source material beam. Forming the first semiconductor column in the trench or between the dielectric pillars using the first source material beam and the second source material beam restricts the formation of the first semiconductor column to a single direction.

20 Claims, 12 Drawing Sheets

(51) Int. Cl.
*H01L 29/10* (2006.01)
*H01L 29/66* (2006.01)
*H01L 21/02* (2006.01)

(52) U.S. Cl.
CPC .. *H01L 21/02631* (2013.01); *H01L 21/02639* (2013.01); *H01L 29/0649* (2013.01); *H01L 29/1037* (2013.01)

(58) Field of Classification Search
CPC .......... H01L 29/1039; H01L 29/66666; H01L 29/1037
See application file for complete search history.

(56) References Cited

U.S. PATENT DOCUMENTS

| | | | | |
|---|---|---|---|---|
| 4,977,096 A * | 12/1990 | Shimada | ............ | H01L 27/14665 148/DIG. 14 |
| 5,120,393 A * | 6/1992 | Kubo | ....................... | C30B 23/02 117/108 |
| 5,176,557 A * | 1/1993 | Okunuki | ............... | H01J 1/3042 117/106 |
| 5,201,681 A * | 4/1993 | Okunuki | ............... | H01J 1/3042 445/24 |
| 5,269,876 A * | 12/1993 | Mizutani | ................. | C30B 25/18 117/106 |
| 5,361,015 A * | 11/1994 | Okunuki | ............... | H01J 1/3042 117/923 |
| 5,828,076 A | 10/1998 | Gossner et al. | | |
| 8,410,496 B2 * | 4/2013 | Hersee | .................. | B82Y 20/00 257/91 |
| 8,716,045 B2 * | 5/2014 | Hersee | .................. | B82Y 20/00 438/41 |
| 2008/0087881 A1 * | 4/2008 | Ueda | .................. | H01L 21/0237 257/40 |
| 2011/0140072 A1 * | 6/2011 | Varangis | ................ | B82Y 20/00 257/9 |
| 2011/0244235 A1 * | 10/2011 | Wildeson | ............... | B82Y 30/00 428/398 |
| 2014/0077220 A1 * | 3/2014 | Kryliouk | ................. | H01L 33/18 257/76 |
| 2014/0220340 A1 * | 8/2014 | Tucker | .................... | C30B 11/12 428/369 |
| 2015/0221843 A1 * | 8/2015 | Choi | ....................... | H01L 33/20 257/98 |
| 2016/0020302 A1 * | 1/2016 | Chen | ................ | H01L 29/66666 438/268 |

OTHER PUBLICATIONS

Controlled polytypic and twin-plane superlattices in III-V nanowires, P. Caroff et al., Nature Nanotechnology | vol. 4 | Jan. 2009 | www.nature.com/naturenanotechnology.

Growth Kinetics in Position-Controlled and Catalyst-free InAs Nanowire Arrays on Si(111) Grown by Selective Area Molecular Beam Epitaxy,S. Hertenberger et al. Institut and Physik Department, Technische Universität München, Garching, 85748, Germany, Journal of Applied Physics 108, 114316 2010.

Vertical "III V" V-Shaped Nanomembranes Epitaxially Grown on a Patterned Si[001] Substrate and Their Enhanced Light Scattering, Sonia Conesa-Boj et al., vol. 6, No. 12, 10982-10991, 2012, www.acsnano.org.

Corresponding Chinese Patent Application 1st Office Action dated Jul. 28, 2017 (40 pgs).

* cited by examiner

US 9,773,889 B2

METHOD OF SEMICONDUCTOR ARRANGEMENT FORMATION

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
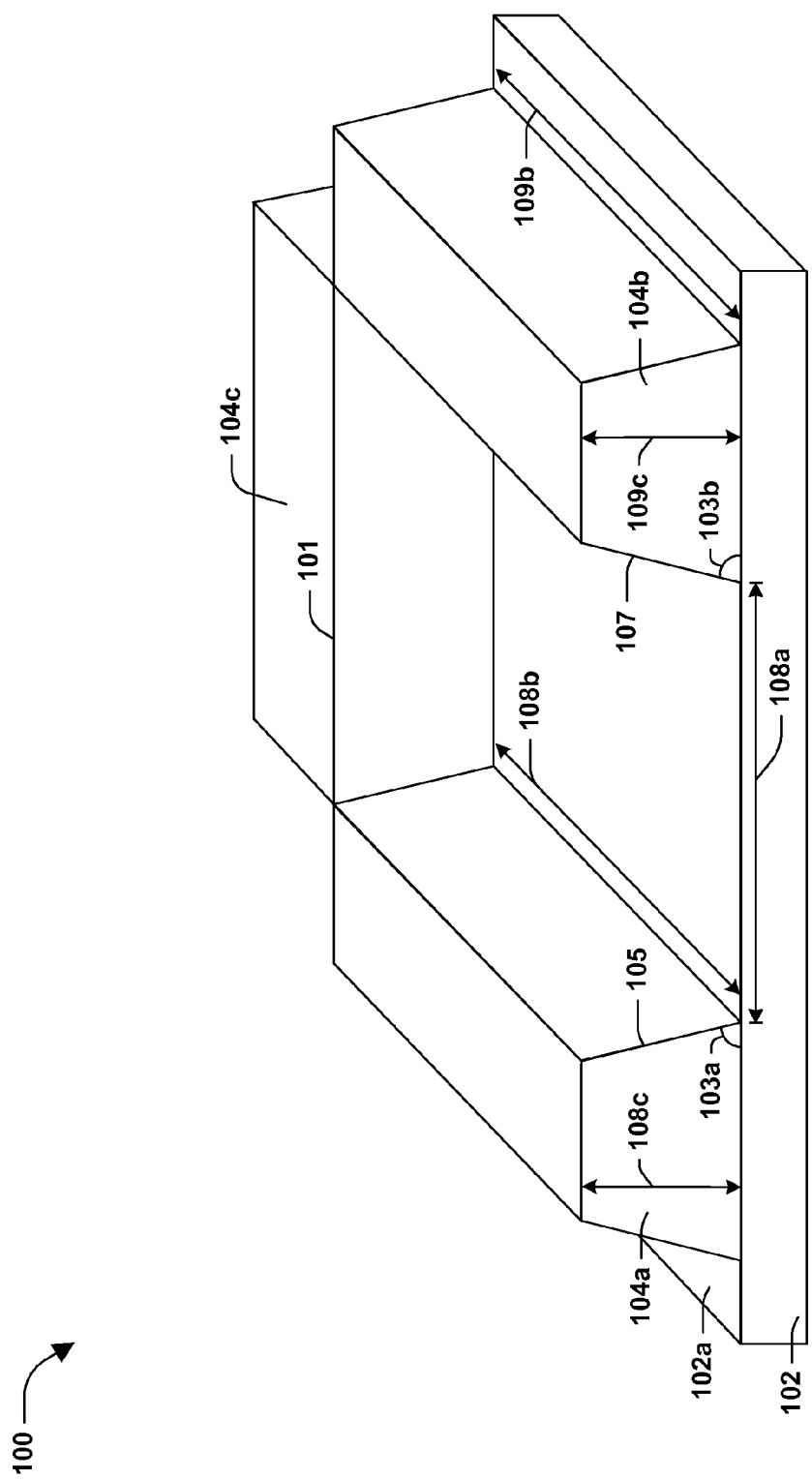
FIG. 1 is an illustration of a perspective view of a semiconductor arrangement at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. Some embodiments of the present disclosure have one or a combination of the following features and/or advantages.

According to some embodiments, a method of forming a semiconductor arrangement comprises forming a first dielectric pillar on a substrate. In some embodiments, the first dielectric pillar is formed such that a first sidewall of the first dielectric pillar is at a first pillar angle between about 60° to about 150° relative to a top surface of the substrate. In some embodiments, the first dielectric pillar has a first pillar height and a first pillar width. In some embodiments, the method of forming a semiconductor arrangement comprises forming a second dielectric pillar on the substrate. In some embodiments, the second dielectric pillar is formed such that a second sidewall of the second dielectric pillar faces the first sidewall. In some embodiments, the second sidewall is at a second pillar angle between about 60° to about 150° relative to the top surface of the substrate. In some embodiments, the second dielectric pillar has a second pillar height and a second pillar width. In some embodiments, the second dielectric pillar is separated a first distance from the first dielectric pillar. In some embodiments, a ratio of the first distance to the first pillar width is larger than the square root of 2. In some embodiments, a ratio of the first pillar width to the first pillar height is less than the square root of 2. In some embodiments, at least one of the ratio of the first distance to the first pillar width or the ratio of the first pillar width to the first pillar height facilitates forming a first semiconductor column at a desired angle relative to the top surface of the substrate by exposing merely a desired area of the substrate to materials from which the semiconductor column is formed.

According to some embodiments, a third dielectric pillar is formed on the substrate such that a third sidewall of the third dielectric pillar is perpendicular to the first sidewall and the second sidewall. In some embodiments, the third sidewall is at a third pillar angle between about 60° to about 150° relative to the top surface of the substrate. In some embodiments, a fourth dielectric pillar is formed over the substrate. In some embodiments, a fourth sidewall of the fourth dielectric pillar is perpendicular to the first sidewall and the second sidewall and faces the third sidewall. In some embodiments, the fourth sidewall is at a fourth pillar angle between about 60° to about 150° relative to the top surface of the substrate. In some embodiments, the third dielectric pillar is separated from the fourth dielectric pillar by a distance substantially equal to at least one of the first pillar width or the second pillar width.

According to some embodiments, a method of forming the semiconductor arrangement comprises forming a trench in a dielectric layer on the substrate. In some embodiments, the trench is defined by at least one of a first sidewall, a second sidewall, a third sidewall, or a fourth sidewall of the dielectric layer. In some embodiments, the first sidewall is at a first trench angle between about 60° to about 150° relative to the top surface of the substrate. In some embodiments, the second sidewall faces the first sidewall and is at a second trench angle between about 60° to about 150° relative to the top surface of the substrate. In some embodiments, the third sidewall is at a third trench angle between about 60° to about 150° relative to the top surface of the substrate. In some embodiments, the fourth sidewall faces the third sidewall and is at a fourth trench angle between about 60° to about 150° relative to the top surface of the substrate. In some embodiments, the trench has a length measured between the first sidewall and the second sidewall. In some embodiments, the trench has a trench width measured between the third sidewall and the fourth sidewall. In some embodiments, the trench has a trench height, as measured from a top surface of the dielectric layer to the top surface of the substrate. In some embodiments, a ratio of the length to the trench width is larger than the square root of 2. In some embodiments, a ratio of the trench width to the trench height is less than the square root of 2. In some embodiments, at least one of the ratio of the length to the trench width or the ratio of the trench width to the trench height facilitates forming the first semiconductor column at a desired angle relative to the top surface of the substrate by exposing merely the desired area of the substrate to materials from which the semiconductor column is formed.

According to some embodiments, a first nucleus is formed on the substrate between the first dielectric pillar, the second dielectric pillar, the third dielectric pillar, and the fourth dielectric pillar. In some embodiments, the first nucleus is formed on the substrate in the trench. In some embodiments, forming the first nucleus comprises applying a first source material beam at a first angle relative to the top surface of the substrate and concurrently applying a second source material beam at a second angle relative to the top surface of the substrate, without rotating the substrate. In some embodiments, a first semiconductor column is formed from the first nucleus by rotating the substrate while applying the first source material beam and the second source material beam. In some embodiments, forming the first semiconductor column between the third dielectric pillar and the fourth dielectric pillar using the first source material beam and the second source material beam promotes the formation of the first semiconductor column in a single direction. In some embodiments, forming the first semiconductor column in the trench using the first source material beam and the second source material beam promotes the formation of the first semiconductor column in a single direction. Further, the first semiconductor column growth direction is at least partially controlled by the presence of at least one of the dielectric pillars or the trench.

Figure 2:
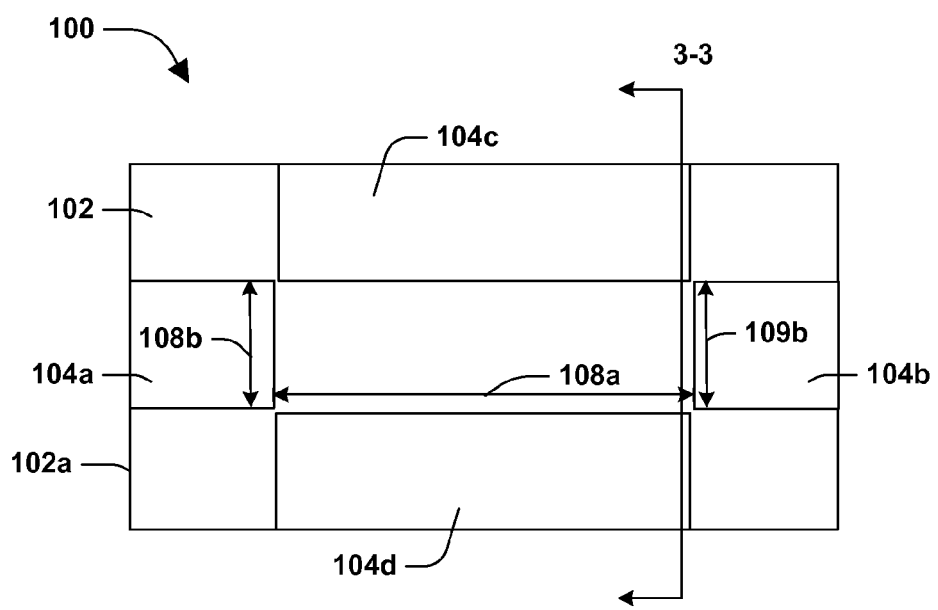
FIG. 2 is an illustration of top down view of a semiconductor arrangement at a stage of fabrication, in accordance with some embodiments.
Figure 3:
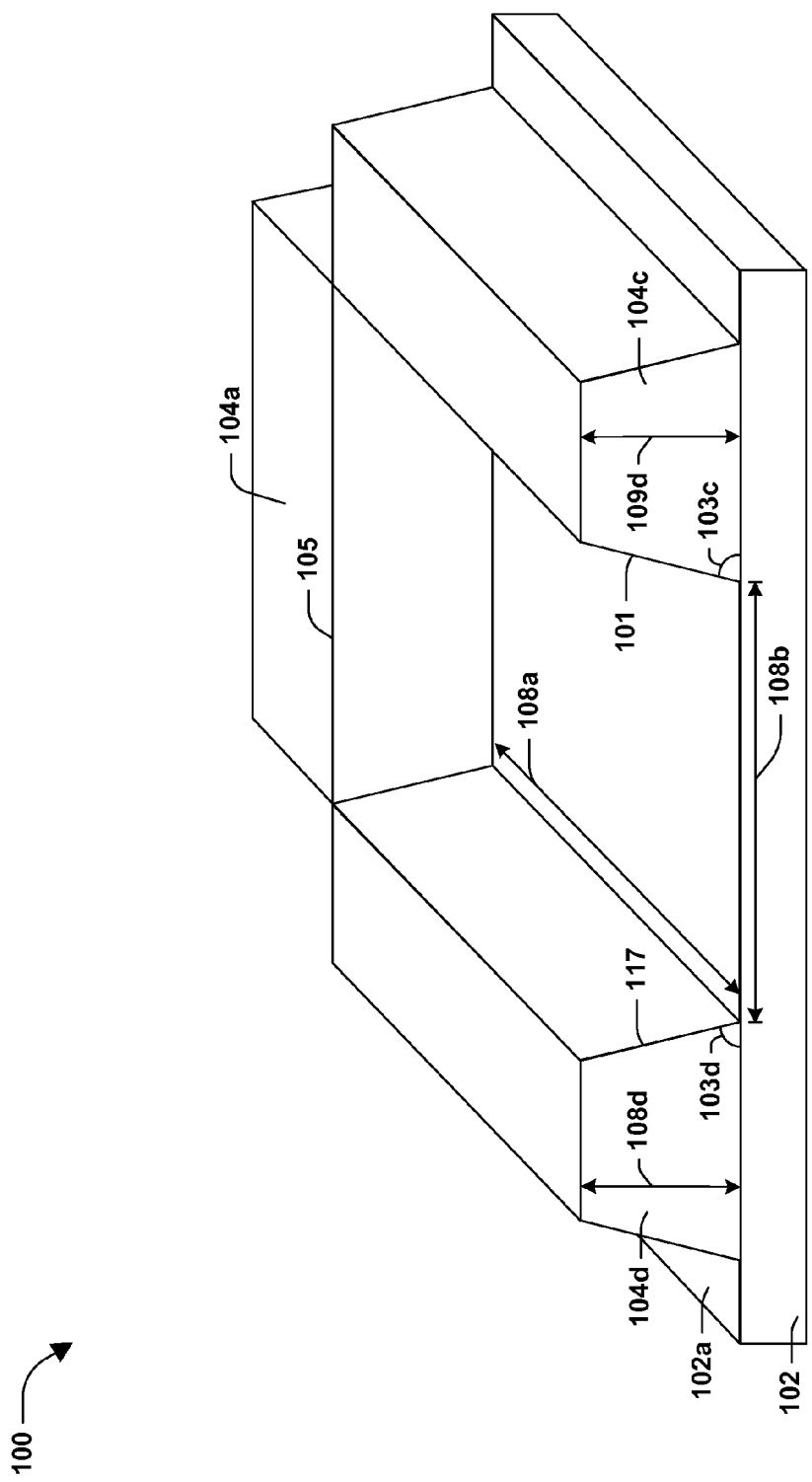
FIG. 3 is an illustration of a perspective view of a semiconductor arrangement at a stage of fabrication, in accordance with some embodiments.

FIGS. 1, 3-9 are perspective views of a semiconductor arrangement 100, FIG. 2 is a top down view of the semiconductor arrangement 100, and FIGS. 10-15 are cross-sectional views of the semiconductor arrangement 100, according to some embodiments, at various stages of fabrication. Turning to FIGS. 1-3, where FIG. 1 illustrates a perspective view of the semiconductor arrangement 100 having a first dielectric pillar 104a, a second dielectric pillar 104b, and a third dielectric pillar 104c, FIG. 2 illustrates a top down view of the semiconductor arrangement 100, and FIG. 3 illustrates a perspective view of FIG. 2 as shown along the line 3-3, which illustrates the first dielectric pillar 104a, the third dielectric pillar 104c, and a fourth dielectric pillar 104d. In some embodiments, at least one of the first dielectric pillar 104a, the second dielectric pillar 104b, the third dielectric pillar 104c or the fourth dielectric pillar 104d is formed on a substrate 102. In some embodiments, at least one of the first dielectric pillar 104a, the second dielectric pillar 104b, the third dielectric pillar 104c or the fourth dielectric pillar 104d are formed by at least one of growth or deposition. In some embodiments, at least one of the first dielectric pillar 104a, the second dielectric pillar 104b, the third dielectric pillar 104c or the fourth dielectric pillar 104d are formed by at least one of atomic layer deposition (ALD), physical vapor deposition (PVD), or chemical vapor deposition (CVD). In some embodiments, at least one of the first dielectric pillar 104a, the second dielectric pillar 104b, the third dielectric pillar 104c or the fourth dielectric pillar 104d are formed by etching. In some embodiments, the substrate 102 includes at least one of an epitaxial layer, a silicon-on-insulator (SOI) structure, a wafer, or a die formed from a wafer. In some embodiments, the substrate 102 comprises at least one of silicon, carbon, etc.

According to some embodiments, such as illustrated in FIGS. 1-2, the first dielectric pillar 104a is formed such that a first sidewall 105 of the first dielectric pillar 104a is at a first pillar angle 103a relative to a top surface 102a of the substrate 102. In some embodiments, the first pillar angle 103a is between about 60° to about 150°. In some embodiments, the first dielectric pillar 104a has a first pillar height 108c and a first pillar width 108b. In some embodiments, the first height 108c is between about 5 nm to about 300 nm. In some embodiments, the first pillar width 108b is between about 5 nm to about 350 nm. In some embodiments, the second dielectric pillar 104b is formed such that a second sidewall 107 of the second dielectric pillar 104b is at a second pillar angle 103b relative to the top surface 102a of the substrate 102. In some embodiments, the second pillar angle 103b is between about 60° to about 150°. In some embodiments, the second dielectric pillar 104b has a second pillar height 109c and a second pillar width 109b. In some embodiments, the second pillar height 109c is between about 5 nm to about 300 nm and the second pillar width 109b is between about 5 nm to about 350 nm. In some embodiments, the second dielectric pillar 104b is separated a first distance 108a from the first dielectric pillar 104a. In some embodiments, the first distance 108a is between about 5 nm to about 500 nm.

According to some embodiments, the first dielectric pillar 104a and the second dielectric pillar 104b abut at least one of the third dielectric pillar 104c or the fourth dielectric pillar 104d. In some embodiments, the first dielectric pillar 104a and the second dielectric pillar 104b are proximate to but are not in contact with at least one of the third dielectric pillar 104c or the fourth dielectric pillar 104d, as illustrated in FIG. 2.

According to some embodiments, such as illustrated in FIGS. 2-3, the third dielectric pillar 104c is formed such that a third sidewall 101 of the third dielectric pillar 104c is at a third pillar angle 103c relative to the top surface 102a of the substrate 102. In some embodiments, the third pillar angle 103c is between about 60° to about 150°. In some embodiments, the third dielectric pillar 104c has a third pillar height 109d and a third pillar width (not shown). In some embodiments, the third pillar width is substantially equal to the first distance 108a. In some embodiments, the third pillar height 109d is between about 5 nm to about 300 nm. In some embodiments, the fourth dielectric pillar 104d is formed such that a fourth sidewall 117 of the fourth dielectric pillar 104d is at a fourth pillar angle 103d relative to the top surface 102a of the substrate 102. In some embodiments, the fourth pillar angle 103d is between about 60° to about 150°. In some embodiments, the fourth dielectric pillar 104d has a fourth pillar height 108d and a fourth pillar width (not shown). In some embodiments, the fourth pillar width is substantially equal to the first distance 108a. In some embodiments, the third pillar height 109d is between about 5 nm to about 300 nm. In some embodiments, a ratio of the first distance 108a to at least one of the first pillar width 108b or the second pillar width 109b is larger than the square root of 2. In some embodiments, a ratio of the first pillar width 108b to the first pillar height 108c is less than the square root of 2. In some embodiments, a ratio of the second pillar width 109b to the second pillar height 109c is less than the square root of 2. A ratio of x to y comprises x divided by y. In some embodiments, the first pillar width 108b is substantially equal the second pillar width 109b. In some embodiments, the first pillar height 108c is substantially equal the second pillar height 109c. In some examples, the first pillar height 108c is about 20 nm, the first pillar width 108b is about 28 nm, and the first distance 108a is about 40 nm. In some embodiments, at least one of the first dielectric pillar 104a, the second dielectric pillar 104b, the third dielectric pillar 104c or the fourth dielectric pillar 104d comprises at least one of silicon, oxide, etc.

Figure 4:
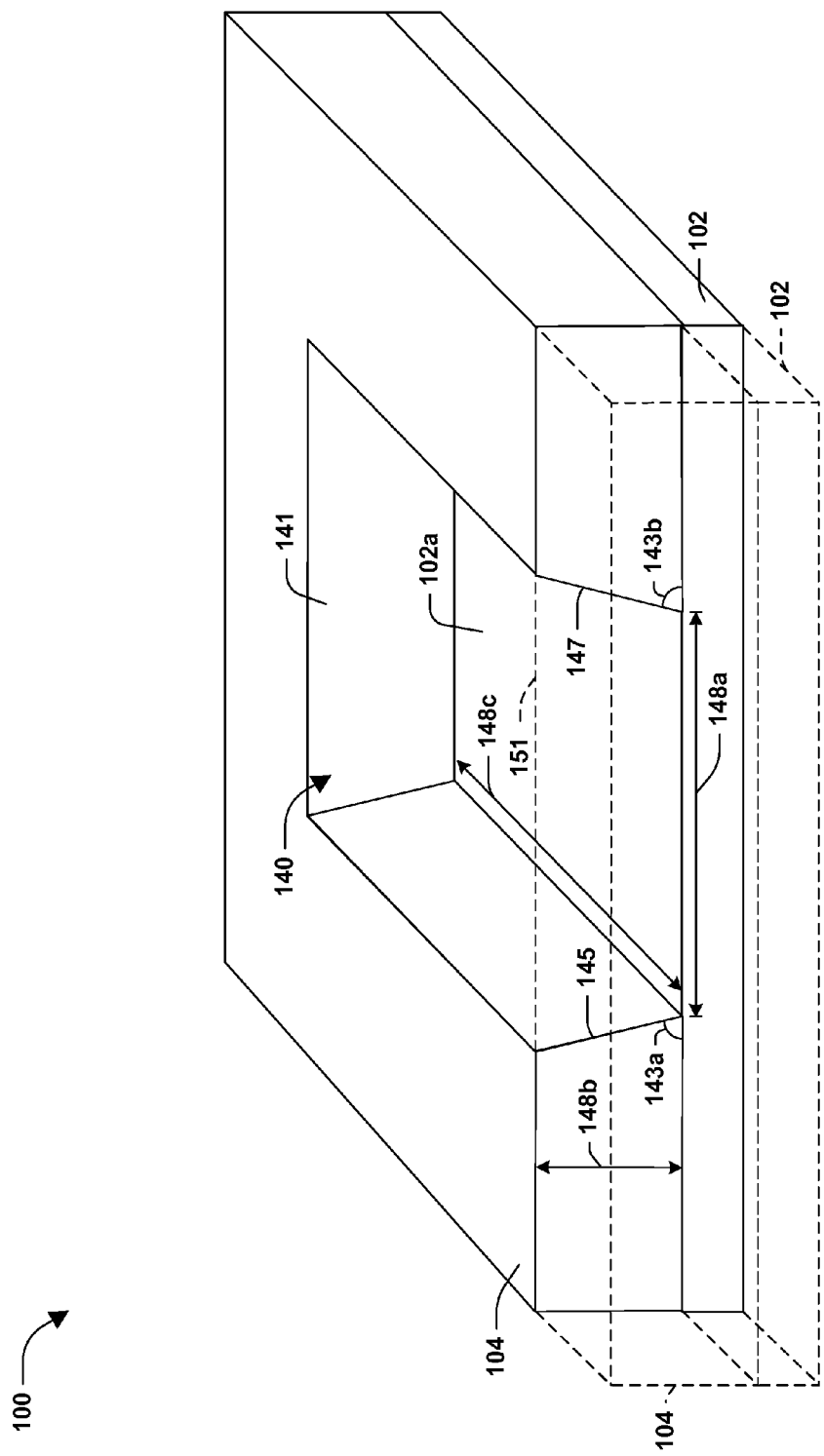
FIG. 4 is an illustration of a perspective view of a semiconductor arrangement at a stage of fabrication, in accordance with some embodiments.

Turning to FIG. 4, a trench 140 is formed from a dielectric layer 104 on the substrate 102, according to some embodiments. In some embodiments, the trench 140 is formed by etching. In some embodiments, the trench 140 is defined by at least one of a first sidewall 145, a second sidewall 147, a third sidewall 141, or a fourth sidewall 151 of the dielectric layer 104. In some embodiments, the dielectric layer 104 comprises at least one of silicon, oxide, etc. In some embodiments, the first sidewall 145 is at a first trench angle 143a between about 60° to about 150° relative to the top surface 102a of the substrate 102. In some embodiments, the second sidewall 147 faces the first sidewall 145. In some embodiments, the second sidewall 147 is at a second trench angle 143b between about 60° to about 150° relative to the top surface 102a of the substrate 102. In some embodiments, the third sidewall 141 is at a third trench angle (not shown) between about 60° to about 150° relative to the top surface 102a of the substrate 102. In some embodiments, the fourth sidewall 151 is shown by dashed lines such that the trench 140 is visible. In some embodiments, the fourth sidewall 151 faces the third sidewall 141. In some embodiments, the fourth sidewall 151 is at a fourth trench angle (not shown) between about 60° to about 150° relative to the top surface 102a of the substrate 102. In some embodiments, the trench 140 has a length 148a measured between the first sidewall 145 and the second sidewall 147. In some embodiments, the trench 140 has a trench width 148c measured between the third sidewall 141 and the fourth sidewall 151. In some embodiments, the trench 140 has a trench height 148b. In some embodiments, the trench height 148b is measured from a top surface of the dielectric layer 104 to the top surface 102a of the substrate 102. In some embodiments, a ratio of the length 148a to the trench width 148c is larger than the square root of 2. In some embodiments, a ratio of the trench width 148c to the trench height 148b is less than the square root of 2.

Figure 5:
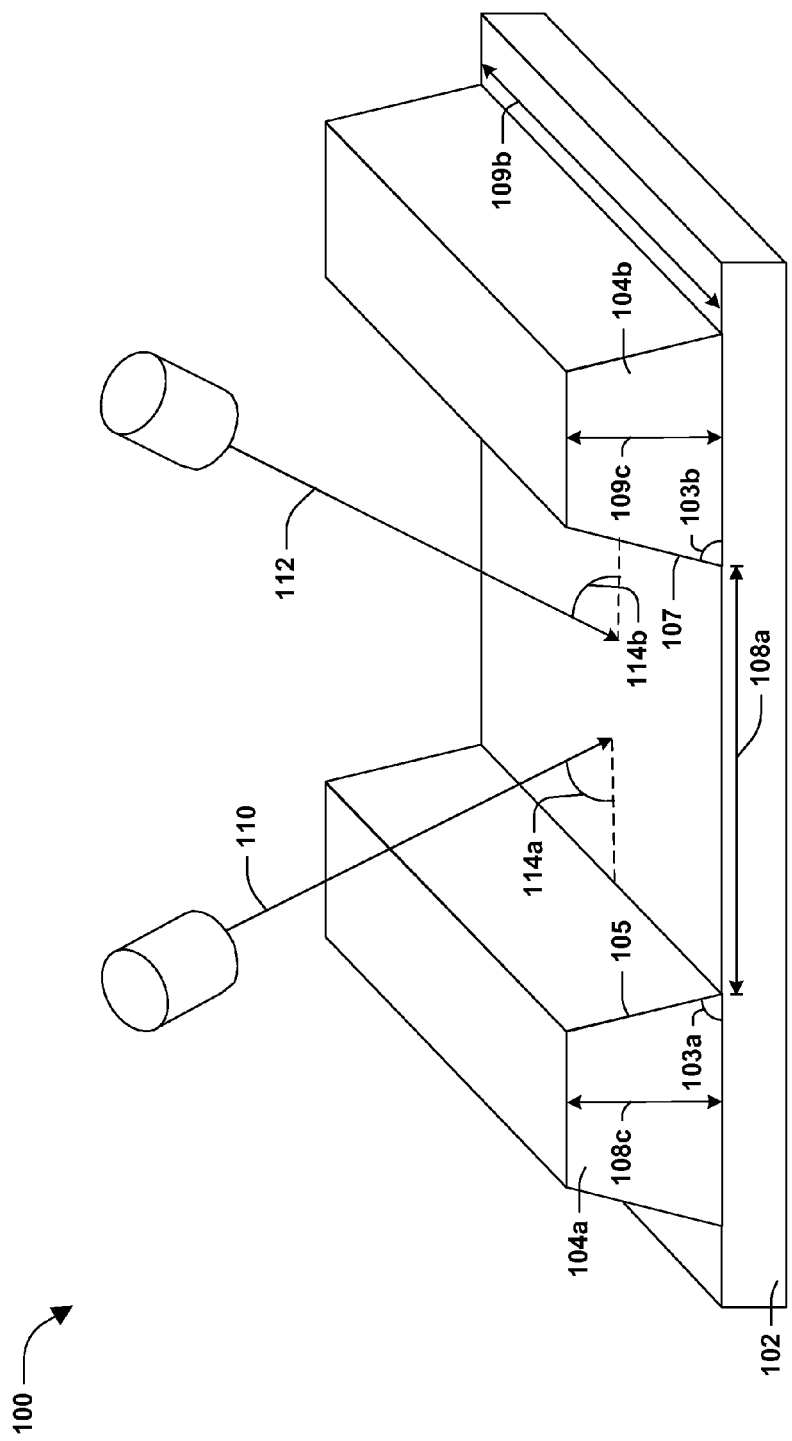
FIG. 5 is an illustration of a perspective view of a semiconductor arrangement at a stage of fabrication, in accordance with some embodiments.

Turning to FIG. 5, a first source material beam 110 is applied at a first angle 114a relative to the top surface 102a of the substrate 102, according to some embodiments. In some embodiments, a second source material beam 112 is applied at a second angle 114b relative to the top surface 102a of the substrate 102. In some embodiments, the first source material beam 110 is applied concurrently with the second source material beam 112. In some embodiments, the first angle 114a is between about 35° to about 60°. In some embodiments, the second angle 114b is between about 35° to about 60°. In some embodiments, applying the first source material beam 110 comprises applying at least one of group II, group III, group IV, group V and group VI materials, etc. In some embodiments, applying the second source material beam 112 comprises applying at least one of group II, group III, group IV, group V and group VI materials, etc. such as arsenic or indium. In some embodiments, the application of at least one of the first source material beam 110 or the second source material beam 112 occurs in an ultra high vacuum chamber. In some embodiments, the first source material beam 110 is applied to the substrate 102 using molecular beam epitaxy. In some embodiments, the second source material beam 112 is applied to the substrate 102 using molecular beam epitaxy. FIG. 5 illustrates the application of the first source beam 110 and the second source beam 112 between the first dielectric pillar 104a and the second dielectric pillar 104b for ease of illustration, however the third dielectric pillar 104c and the fourth dielectric pillar 104d are present in some embodiments. In some embodiments, the first source beam 110 and the second source beam 112 are applied to the substrate 102 in the trench 140, where the first sidewall 105 of the first dielectric pillar 104a corresponds to the first sidewall 145 defining the trench 140 and the second sidewall 107 of the second dielectric pillar 104b corresponds to the second sidewall 147 defining the trench 140.

Figure 6:
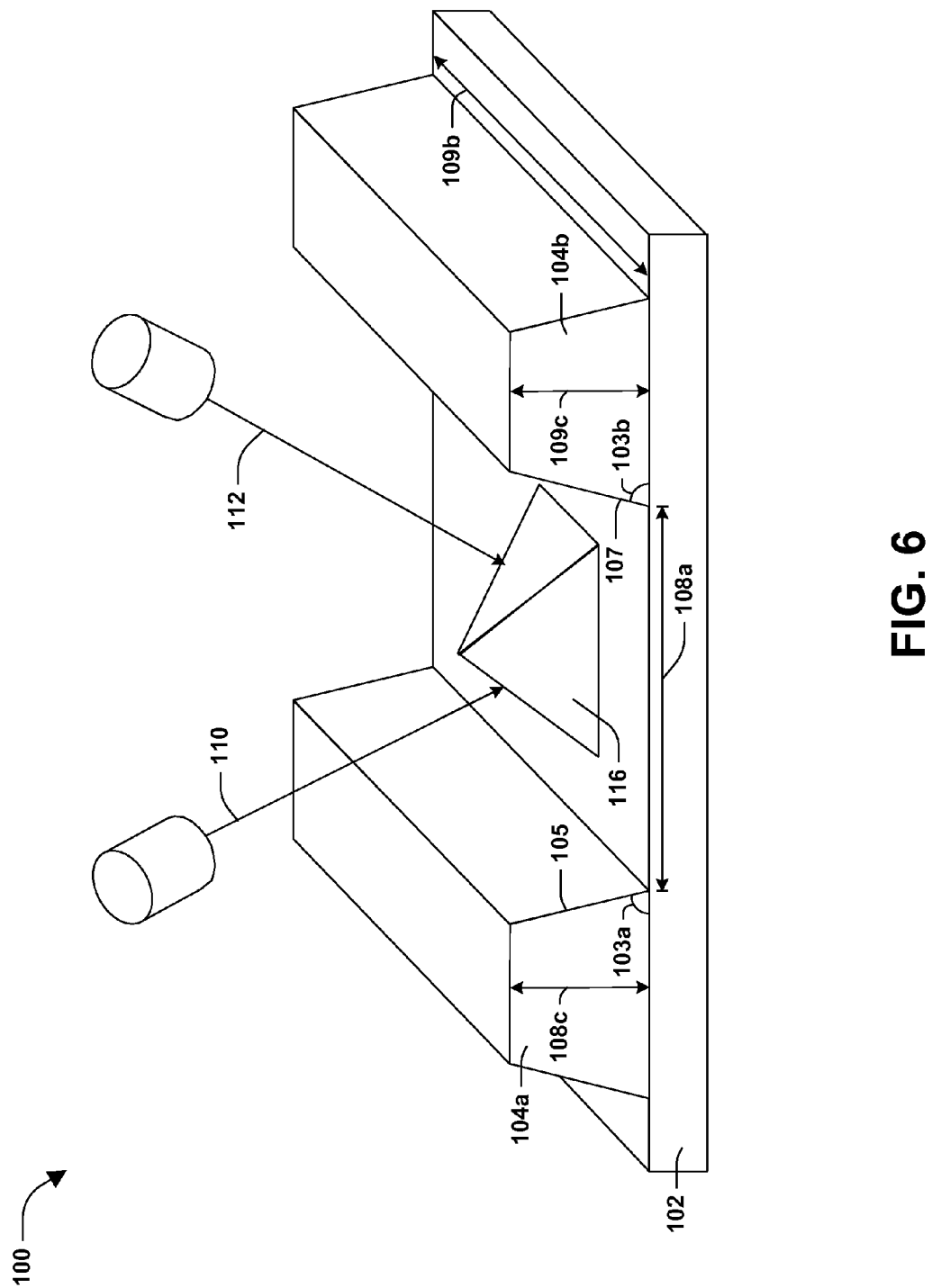
FIG. 6 is an illustration of a perspective view of a semiconductor arrangement at a stage of fabrication, in accordance with some embodiments.

Turning to FIG. 6, a first nucleus 116 is formed on the substrate 102 between the first dielectric pillar 104a, the second dielectric pillar 104b, the third dielectric pillar 104c, as shown in FIG. 3, and the fourth dielectric pillar 104d, as shown in FIG. 3, due to at least one of the application of the first source material beam 110 or the second source material beam 112, according to some embodiments. In some embodiments, the first nucleus 116 is formed on the substrate 102 in the trench 140, as shown in FIG. 4, due to at least one of the application of the first source material beam 110 or the second source material beam 112. In some embodiments, the first nucleus 116 comprises a shape, such as at least one of a pyramidal shape, a polygonal shape, a triangular shape, etc. In some embodiments, the first nucleus 116 shape is determined by an orientation of molecules/ atoms on the top surface 102a of the substrate 102. In some embodiments, the first nucleus 116 is formed in an ultra high vacuum chamber. In some embodiments, the first nucleus 116 comprises at least one of group II, group III, group IV, group V and group VI materials, etc., such as arsenic or indium. In some embodiments, the first nucleus 116 is grown.

Figure 7:
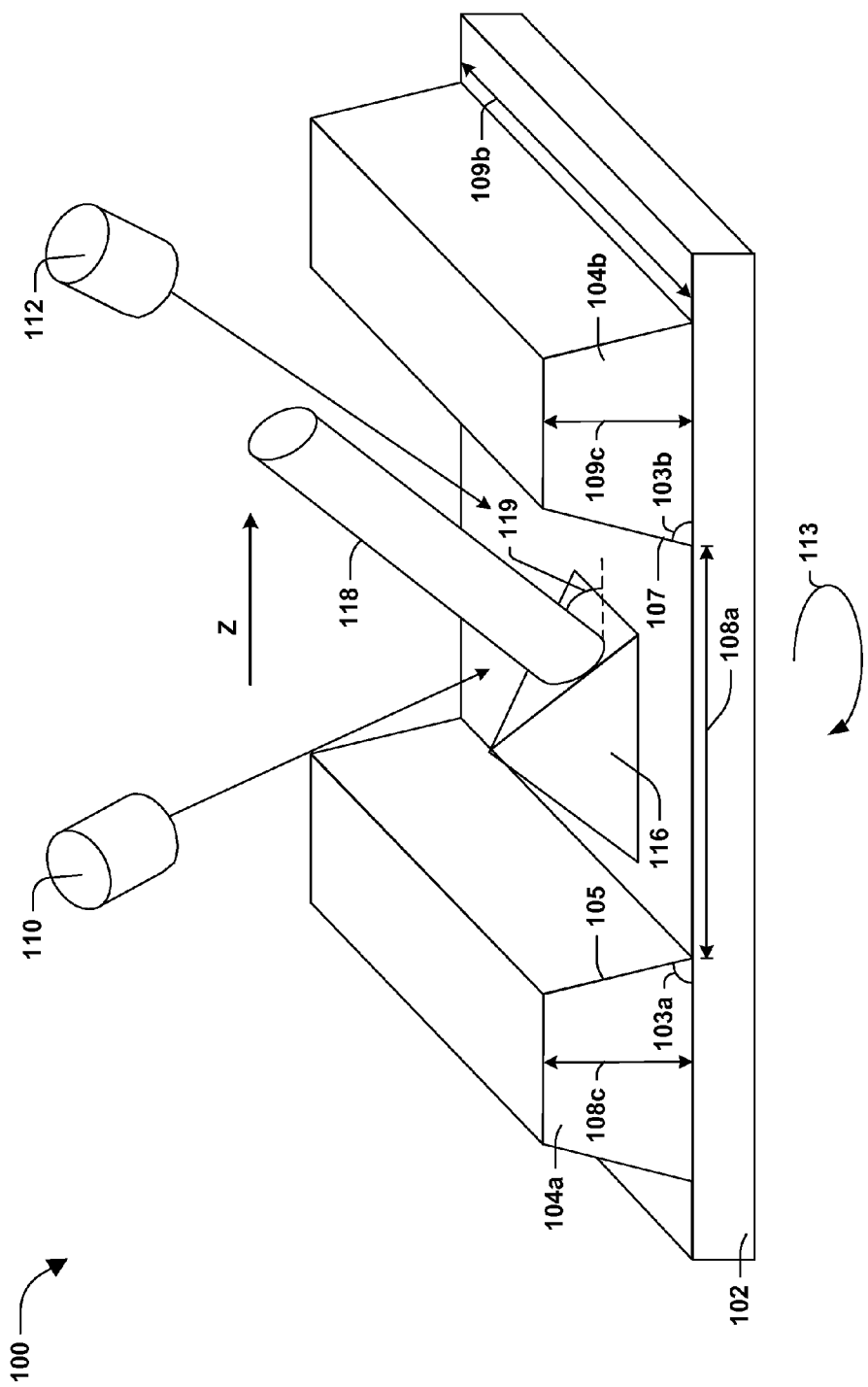
FIG. 7 is an illustration of a perspective view of a semiconductor arrangement at a stage of fabrication, in accordance with some embodiments.

Turning to FIG. 7, a first semiconductor column 118 is formed from the first nucleus 116 by rotating 113 the substrate 102, and structures thereon, while applying the first source material beam 110 and the second source material beam 112. In some embodiments, the first semiconductor column 118 is grown. In some embodiments, the first semiconductor column 118 is grown at a first semiconductor column angle 119 relative to the top surface 102a of the substrate 102. In some embodiments, the first semiconductor column 118 is formed coincident with at least one of the third sidewall 101 of the third dielectric pillar 104c, or the fourth sidewall 117 of the fourth dielectric pillar 104d, as illustrated in FIG. 3, such as in the z direction. In some embodiments, the first semiconductor column 118 is formed coincident with at least one of the third sidewall 141 defining the trench 140 or the fourth sidewall 151 defining the trench 140, as illustrated in FIG. 4. In some embodiments, a direction of growth of the first semiconductor column 118 is substantially parallel to a direction of the length 148a of the trench 140. In some embodiments, the first semiconductor column angle 119 is determined by a lattice orientation of the substrate 102. In some embodiments, the substrate 102 is rotated such that at least one of the first source material beam 110 or the second source material beam 112 is applied substantially evenly to the first nucleus 116 and the resulting first semiconductor column 118 to facilitate growth of the first semiconductor column 118 in accordance with lattice orientation of the substrate 102. In some embodiments, the first semiconductor column angle 119 is between about 15° to about 90°. In some embodiments, the first semiconductor column 118 is formed in an ultra high vacuum chamber. In some embodiments, the first semiconductor column 118 comprises at least one of group II, group III, group IV, group V and group VI materials, etc. such as arsenic or indium. In some embodiments, the growth of the first semiconductor column 118 is limited to a single direction by the presence of the third dielectric pillar 104c and the fourth dielectric pillar 104d, as illustrated in FIG. 3. In some embodiments, a cross section of the first semiconductor column 118 has a width between about 5 nm to 300 nm. In some embodiments, a cross section of the first semiconductor column 118 has at least one of a polygonal shape, a circular shape, an oval shape, a triangular shape, etc.

Figure 8:
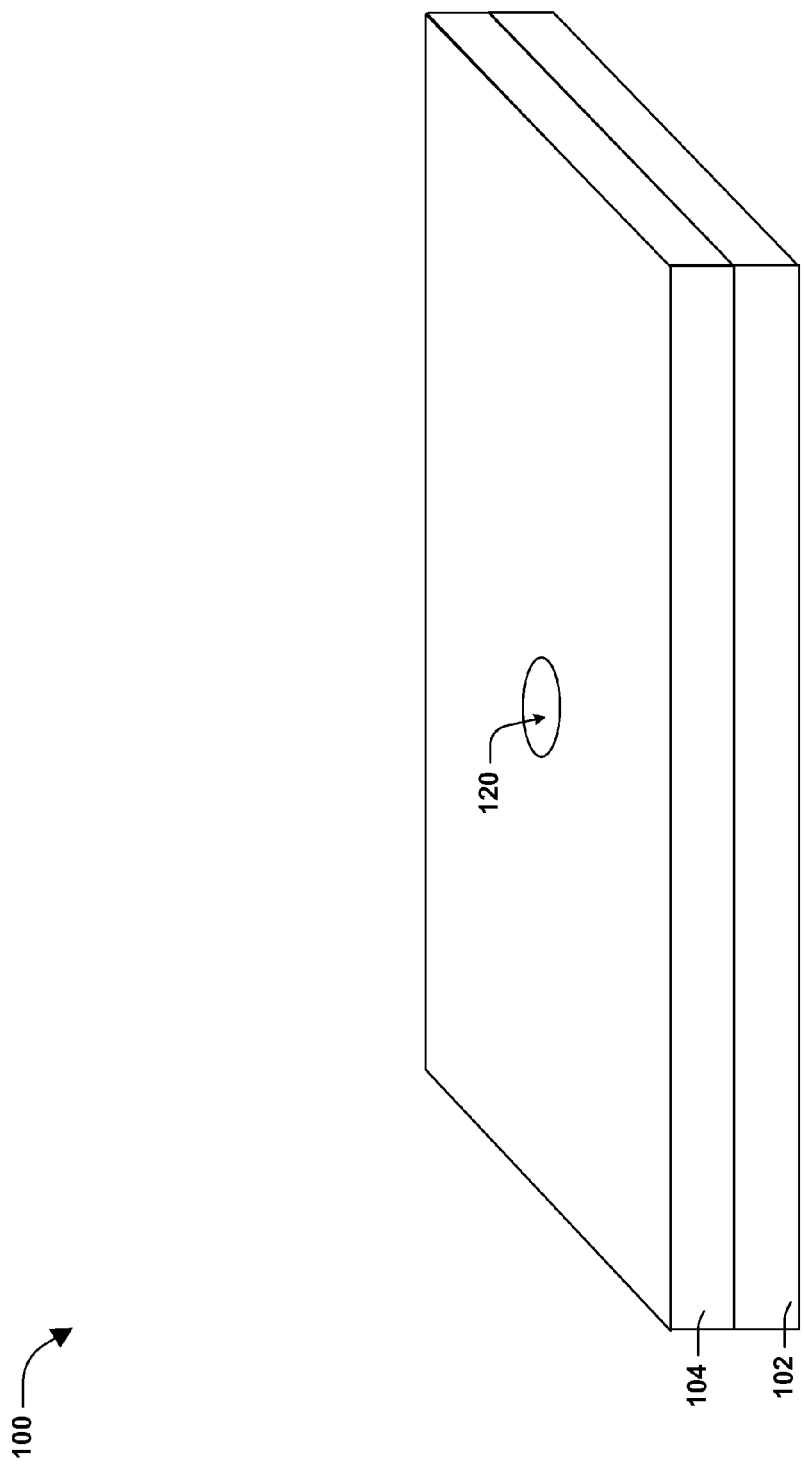
FIG. 8 is an illustration of a perspective view of a semiconductor arrangement at a stage of fabrication, in accordance with some embodiments.

Turning to FIG. 8, an alternative method of semiconductor arrangement 100 formation is illustrated. In some embodiments, a layer of dielectric material 104 is formed over the substrate 102, according to some embodiments. In some embodiments, the layer of dielectric material 104 comprises at least one of silicon, oxide, etc. In some embodiments, a first opening 120 is formed in the layer of dielectric material 104. In some embodiments, the first opening 120 exposes at least some of the substrate 102.

Figure 9:
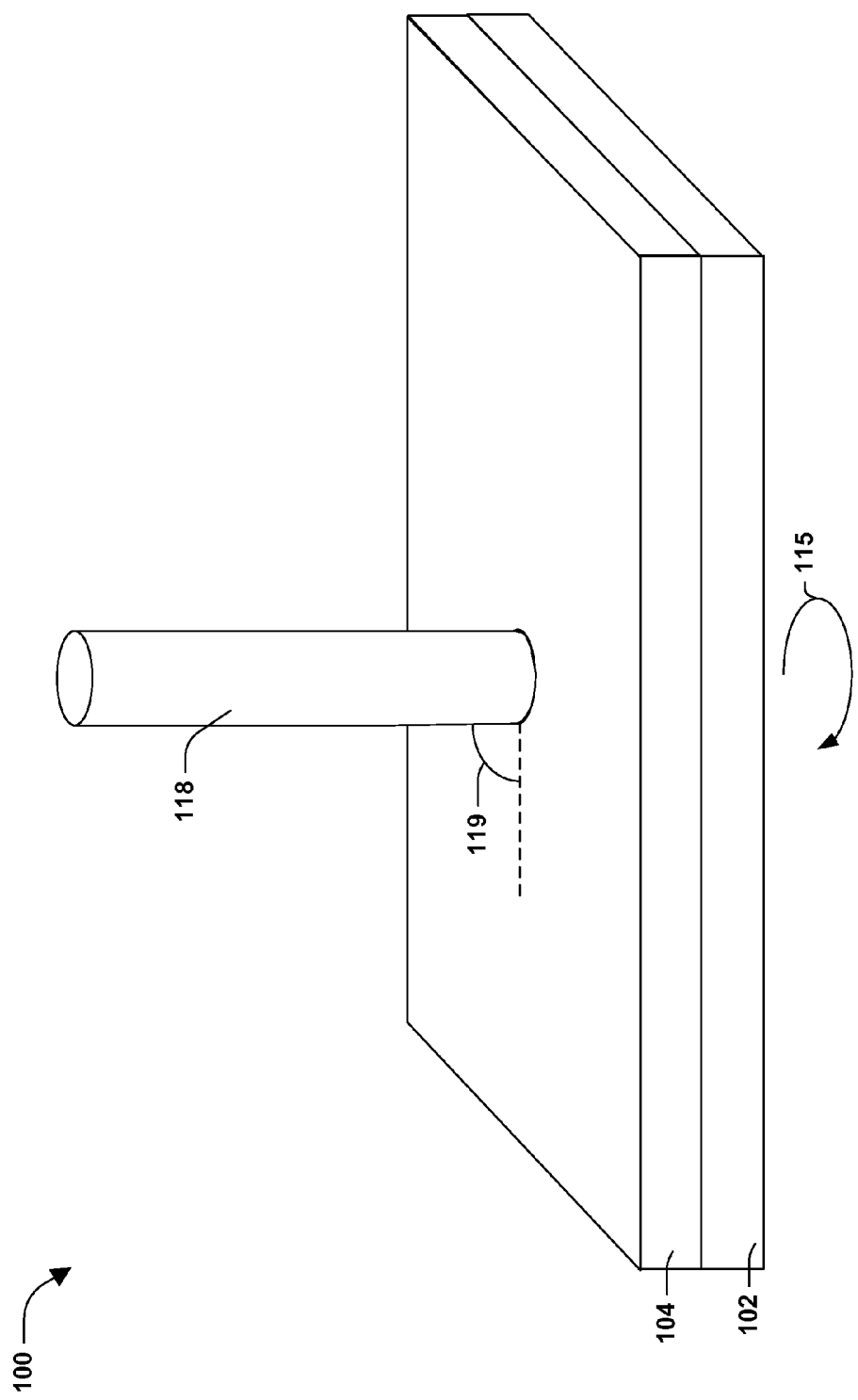
FIG. 9 is an illustration of a perspective view of a semiconductor arrangement at a stage of fabrication, in accordance with some embodiments.

Turning to FIG. 9, the first semiconductor column 118 is formed in the first opening 120, according to some embodiments. In some embodiments, the first source material beam 110 (not shown) is applied to the at least some of the substrate 102 exposed by the first opening 120. In some embodiments, the second source material beam 112 (not shown) is applied to the at least some of the substrate 102 exposed by the first opening 120. In some embodiments, the first source material beam 110 is applied concurrently with the second source material beam 112 to form the first semiconductor column 118. In some embodiments, the substrate 102 is rotated 115 to form the first semiconductor column 118. In some embodiments, the substrate 102 is rotated concurrently with the application of at least one of the first source material beam 110 or the second source material beam 112. In some embodiments, a shape of the first opening 120 determines a shape of the first semiconductor column 118. In some embodiments, a width or diameter of the first opening 120 determines the width of a cross section of the first semiconductor column 118. In some embodiments, the first semiconductor column angle 119 is about 90°.

Figure 10:
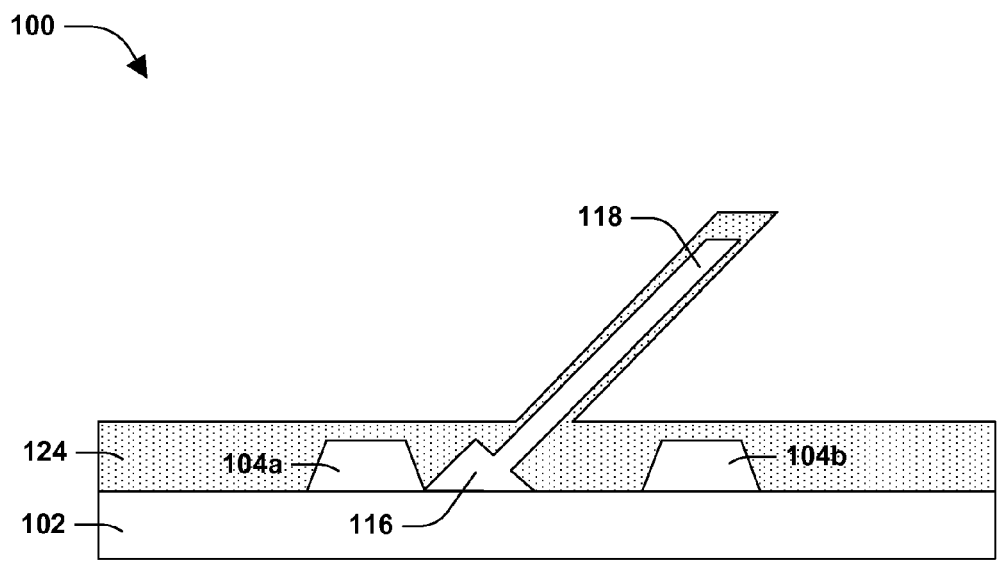
FIG. 10 is an illustration of a cross sectional view of a semiconductor arrangement at a stage of fabrication, in accordance with some embodiments.

Turning to FIG. 10, a simplified cross sectional view of the semiconductor arrangement 100 as illustrated in FIG. 7 is shown, according to some embodiments. In some embodiments, a first insulating layer 124 is formed over the substrate 102, the first dielectric pillar 104a, the second dielectric pillar 104b, the first nucleus 116, and the first semiconductor column 118. In some embodiments, the first insulating layer 124 comprises a high dielectric constant material, such as oxide. In some embodiments, the first insulating layer 124 is formed by at least one of a spin on technique, PVD, CVD, ALD, etc. In some embodiments, the first insulating layer 124 has a first insulting thickness between about 200 nm to about 700 nm. Though the first dielectric pillar 104a and the second dielectric pillar 104b are illustrated, the first semiconductor column 118 as formed in the trench 140 is used. In some embodiments, the first insulating layer 124 is formed in the trench 140 and planerized such that a top surface of the first insulating layer 124 is substantially uniform or flush with the top surface of the dielectric layer 104. In some embodiments, dielectric layer 104 is removed, such as by etching, after the first semiconductor column 118 is formed and then the first insulating layer 124 is formed. Additionally, though the first semiconductor column 118 is depicted in the presence of the first dielectric pillar 104a and the second dielectric pillar 104b, the first semiconductor column 118 as formed in FIGS. 5-6 may also be used.

Figure 11:
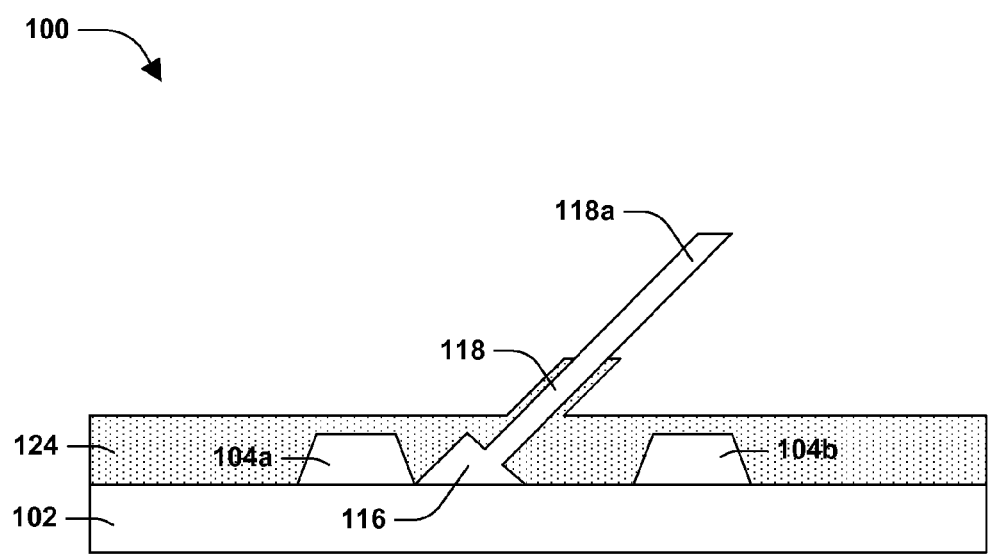
FIG. 11 is an illustration of a cross sectional view of a semiconductor arrangement at a stage of fabrication, in accordance with some embodiments.

Turning to FIG. 11, at least some of the first insulating layer 124 is removed to expose at least some of a first portion 118a of the first semiconductor column 118, according to some embodiments. In some embodiments, the first insulating layer 124 is removed by etching.

Figure 12:
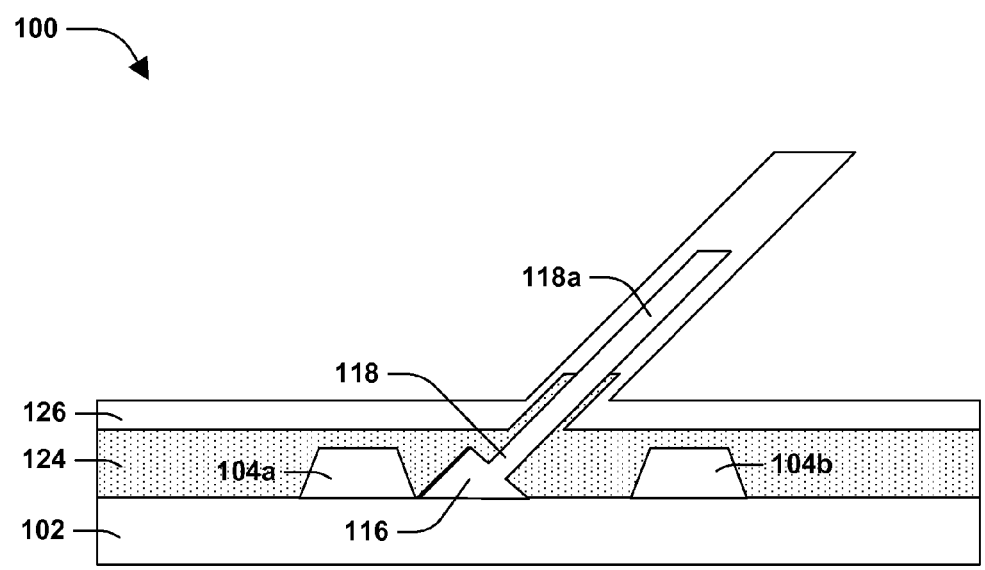
FIG. 12 is an illustration of a cross sectional view of a semiconductor arrangement at a stage of fabrication, in accordance with some embodiments.

Turning to FIG. 12, a source material 126 is formed around the first semiconductor column 118, according to some embodiments. In some embodiments, the source material 126 is formed over the first insulting layer 124. In some embodiments, the source material 126 comprises a conductive material, such as metal or a doped material. In some embodiments, the source material 126 is formed by at least one of a spin on technique, PVD, CVD, ALD, etc. In some embodiments, the source material 126 has a first source thickness between about 200 nm to about 700 nm.

Figure 13:
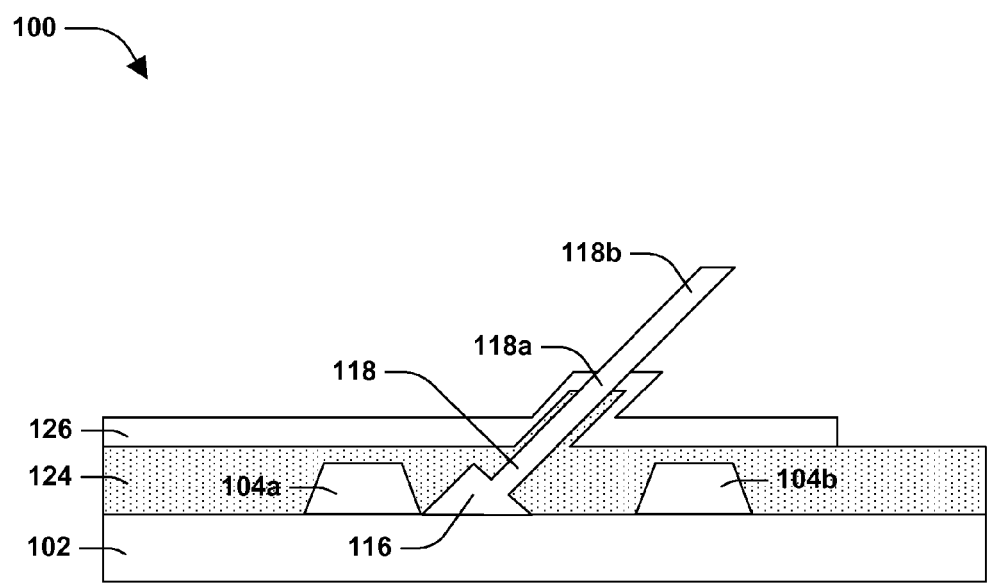
FIG. 13 is an illustration of a cross sectional view of a semiconductor arrangement at a stage of fabrication, in accordance with some embodiments.

Turning to FIG. 13, the source material 126 is removed to expose at least some of a second portion 118b of the first semiconductor column 118, according to some embodiments. In some embodiments, the second portion 118b is disposed on the first semiconductor column 118 such that the first portion 118a is between the substrate 102 and the second portion 118b. In some embodiments, the source material 126 is removed by etching.

Figure 14:
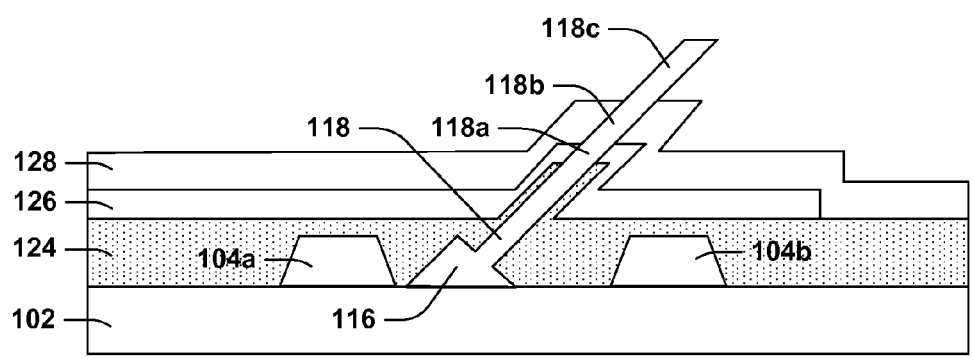
FIG. 14 is an illustration of a cross sectional view of a semiconductor arrangement at a stage of fabrication, in accordance with some embodiments.

Turning to FIG. 14, a gate dielectric 128 is formed around the first semiconductor column 118, according to some embodiments. In some embodiments, the gate dielectric 128 is formed over the first insulting layer 124. In some embodiments, gate dielectric 128 comprises a low dielectric constant material, such as oxide. In some embodiments, the gate dielectric 128 is formed by at least one of a spin on technique, PVD, CVD, ALD, etc. In some embodiments, at least some of the gate dielectric 128 is removed such that at least some of a third portion 118c of the first semiconductor column 118 is exposed. In some embodiments, the second portion 118b is between the first portion 118a and the third portion 118c. In some embodiments, the gate dielectric 128 is removed by etching.

Figure 15:
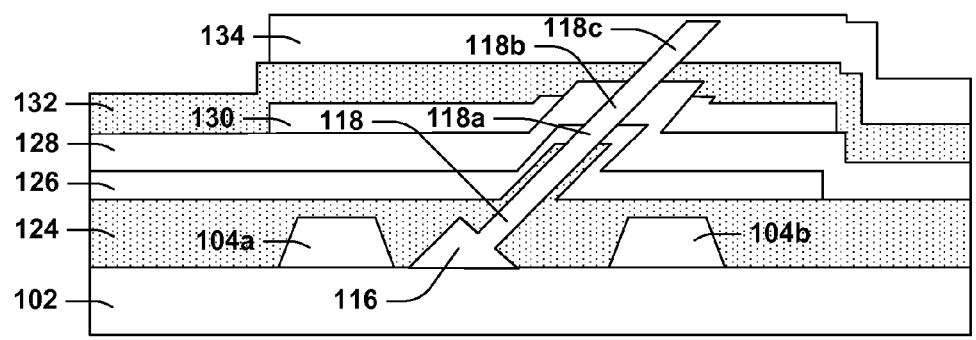
FIG. 15 is an illustration of a cross sectional view of a semiconductor arrangement at a stage of fabrication, in accordance with some embodiments.

Turning to FIG. 15, a gate material 130 is formed around the gate dielectric 128 surrounding the first semiconductor column 118, according to some embodiments. In some embodiments, the gate material 130 comprises a conductive material, such as metal. In some embodiments, the gate material 130 is formed by at least one of a spin on technique, PVD, CVD, ALD, etc. In some embodiments, at least some of the gate material 130 is removed, such that little to none of the gate material 130 is in direct contact with the first semiconductor column 118.

According to some embodiments, a second insulating layer 132 is formed over the gate dielectric 128, the gate material 130, and the first semiconductor column 118. In some embodiments, the second insulating layer 132 comprises a high dielectric constant material, such as oxide. In some embodiments, the second insulating layer 132 is formed by at least one of a spin on technique, PVD, CVD, ALD, etc. In some embodiments, the second insulating layer 132 has a second insulting thickness between about 200 nm to about 700 nm. In some embodiments, at least some of the second insulating layer 132 is removed to expose at least some of the third portion 118c of the first semiconductor column 118, according to some embodiments. In some embodiments, the second insulating layer 132 is removed by etching.

According to some embodiments, a drain material 134 is formed around the third portion 118c of the first semiconductor column 118, according to some embodiments. In some embodiments, the drain material 134 is formed over the second insulting layer 132. In some embodiments, the drain material 134 comprises a conductive material, such as metal or a highly doped material. In some embodiments, the drain material 134 is formed by at least one of a spin on technique, PVD, CVD, ALD, etc. In some embodiments, the drain material 134 has a first drain thickness between about 200 nm to about 700 nm. In some embodiments, a transistor comprises at least one of the source material 126, the first portion 118a, the gate material 130, the second portion 118b, the drain material 134 or the third portion 118c. In some embodiments, at least one of the source material 126 or the first portion 118a comprise source of a transistor. In some embodiments, at least one of the drain material 134 or the third portion 118c comprise a drain of a transistor. In some embodiments, at least some of the second portion 118b comprises a channel of a transistor. In some embodiments, forming the first semiconductor column 118 in the trench 140 or between the third dielectric pillar 104c and the fourth dielectric pillar 104d using the first source material beam 110 and the second source material beam 112 constrains the formation of the first semiconductor column 118 to a single direction. In some embodiments, the first semiconductor column 118 growth direction is at least partially controlled by the presence of at least one of the third sidewall 141 or the fourth sidewall 151 defining the trench 140, or the third dielectric pillar 104c and the third dielectric pillar 104c. In some embodiments, a transistor formed using the semiconductor column 118 having the single direction exhibits desired electrical performance, such as desired current flow through the channel given application of a particular voltage to the gate.

According to some embodiments, a method of forming a semiconductor arrangement comprises forming a first nucleus on a substrate between a first dielectric pillar and a second dielectric pillar. In some embodiments, the forming a first nucleus comprises applying a first source material beam at a first angle relative to a top surface of the substrate and applying a second source material beam at a second angle relative to the top surface of the substrate. According to some embodiments, the method of forming a semiconductor arrangement comprises forming a first semiconductor column from the first nucleus by rotating the substrate while applying the first source material beam and the second source material beam.

According to some embodiments, a method of forming a semiconductor arrangement comprises forming a trench in a dielectric layer on a substrate such that the trench is defined by at least one of a first sidewall, a second sidewall, a third sidewall, or a fourth sidewall of the dielectric layer. In some embodiments, at least one of the first sidewall is at a first trench angle between about 60° to about 150° relative to a top surface of the substrate, the second sidewall is at a second trench angle between about 60° to about 150° relative to the top surface of the substrate, the third sidewall is at a third trench angle between about 60° to about 150° relative to the top surface of the substrate, or the fourth sidewall is at a fourth trench angle between about 60° to about 150° relative to the top surface of the substrate. According to some embodiments, the method of forming a semiconductor arrangement comprises forming a first nucleus on the substrate in the trench. In some embodiments, the forming a first nucleus comprises applying a first source material beam at a first angle relative to the top surface of the substrate and applying a second source material beam at a second angle relative to the top surface of the substrate. According to some embodiments, the method of forming a semiconductor arrangement comprises forming a first semiconductor column from the first nucleus by rotating the substrate while applying the first source material beam and the second source material beam.

According to some embodiments, a method of forming a semiconductor arrangement comprises forming a first dielectric pillar on a substrate, the first dielectric pillar having a first pillar height and a first pillar width. According to some embodiments, the method of forming a semiconductor arrangement comprises forming a second dielectric pillar on the substrate, the second dielectric pillar having a second pillar height and a second pillar width. In some embodiments, the second dielectric pillar is separated a first distance from the first dielectric pillar, where a ratio of the first distance to the first pillar width is larger than the square root of 2, and a ratio of the first pillar width to the first pillar height is less than the square root of 2. According to some embodiments, the method of forming a semiconductor arrangement comprises forming a first nucleus on a substrate between a first dielectric pillar and a second dielectric pillar. In some embodiments, the forming a first nucleus comprises applying a first source material beam at a first angle relative to a top surface of the substrate and applying a second source material beam at a second angle relative to the top surface of the substrate. According to some embodiments, the method of forming a semiconductor arrangement comprises forming a first semiconductor column from the first nucleus by rotating the substrate while applying the first source material beam and the second source material beam.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement comprising:
    forming a first nucleus on a substrate between a first dielectric pillar and a second dielectric pillar while the substrate is stationary, wherein:
        the forming a first nucleus comprises:
            applying a first source material beam at a first angle relative to a top surface of the substrate; and
            applying a second source material beam at a second angle relative to the top surface of the substrate, and
        a distance between the first nucleus and the first dielectric pillar is less than a distance between the first nucleus and the second dielectric pillar;
    forming a first semiconductor column from the first nucleus by rotating the substrate while applying the first source material beam and the second source material beam;
    forming a source material around a first portion of the first semiconductor column;
    forming a gate material around a second portion of the first semiconductor column over the source material, where the first portion is between the substrate and the second portion; and
    forming a drain material around a third portion of the first semiconductor column over the gate material, where the second portion is between the first portion and the third portion.

2. The method of claim 1, comprising:
    forming the first dielectric pillar such that a first sidewall of the first dielectric pillar is at a first pillar angle between about 60° to about 150° relative to the top surface of the substrate; and
    forming the second dielectric pillar such that a second sidewall of the second dielectric pillar faces the first sidewall and is at a second pillar angle between about 60° to about 150° relative to the top surface of the substrate.

3. The method of claim 2, comprising:
    forming a third dielectric pillar such that a third sidewall of the third dielectric pillar is perpendicular to the first sidewall and the second sidewall, where the third sidewall is at a third pillar angle between about 60° to about 150° relative to the top surface of the substrate; and
    forming a fourth dielectric pillar such that a fourth sidewall of the fourth dielectric pillar is perpendicular to the first sidewall and the second sidewall, where the fourth sidewall faces the third sidewall and is at a fourth pillar angle between about 60° to about 150° relative to the top surface of the substrate.

4. The method of claim 1, at least one of:
the forming a first nucleus comprising forming the first nucleus in an ultra high vacuum chamber; or
the forming a first semiconductor column comprising forming the first semiconductor column in the ultra high vacuum chamber.

5. The method of claim 1, the applying a first source material beam comprising applying at least one of group II, group III, group IV, group V, or group VI materials at the first angle, the first angle between about 35° to about 60°.

6. The method of claim 1, the applying a second source material beam comprising applying at least one of group II, group III, group IV, group V, or group VI materials at the second angle, the second angle between about 35° to about 60°.

7. The method of claim 1, at least one of:
the applying a first source material beam comprising using molecular beam epitaxy; or
the applying a second source material beam comprising using molecular beam epitaxy.

8. The method of claim 1, the forming a first semiconductor column comprising growing the first semiconductor column at a first semiconductor column angle relative to the top surface of the substrate and coincident with at least one of a first sidewall of the first dielectric pillar or a second sidewall of the second dielectric pillar.

9. A method of forming a semiconductor arrangement comprising:
forming a first dielectric pillar on a substrate, the first dielectric pillar having a first pillar height and a first pillar width;
forming a second dielectric pillar on the substrate, the second dielectric pillar having a second pillar height and a second pillar width, wherein:
the second dielectric pillar is separated a first distance from the first dielectric pillar,
a ratio of the first distance to the first pillar width is larger than the square root of 2, and
a ratio of the first pillar width to the first pillar height is less than the square root of 2;
forming a first nucleus on the substrate between the first dielectric pillar and the second dielectric pillar while the substrate is stationary, wherein:
the forming a first nucleus comprises:
applying a first source material beam at a first angle relative to a top surface of the substrate; and
applying a second source material beam at a second angle relative to the top surface of the substrate, and
a distance between the first nucleus and the first dielectric pillar is less than a distance between the first nucleus and the second dielectric pillar; and
forming a first semiconductor column from the first nucleus by rotating the substrate while applying the first source material beam and the second source material beam.

10. The method of claim 9, at least one of:
the forming a first dielectric pillar comprising forming the first dielectric pillar such that a first sidewall of the first dielectric pillar is at a first pillar angle between about 60° to about 150° relative to the top surface of the substrate; or
the forming a second dielectric pillar comprising forming the second dielectric pillar such that a second sidewall of the second dielectric pillar is at a second pillar angle between about 60° to about 150° relative to the top surface of the substrate.

11. The method of claim 9, at least one of:
the applying a first source material beam comprising using molecular beam epitaxy to apply at least one of group II, group III, group IV, group V, or group VI materials at the first angle, the first angle between about 35° to about 60°; or
the applying a second source material beam comprising using molecular beam epitaxy to apply at least one of group II, group III, group IV, group V, or group VI materials at the second angle, the second angle between about 35° to about 60°.

12. The method of claim 9, comprising:
forming a first insulating layer over the first nucleus and around the first semiconductor column;
forming a doped material layer over the first insulating layer and around the first semiconductor column; and
forming a gate dielectric layer over the doped material layer and around the first semiconductor column.

13. A method of forming a semiconductor arrangement comprising:
forming a first nucleus on a substrate between a first dielectric pillar and a second dielectric pillar while the substrate is stationary, wherein:
the forming a first nucleus comprises:
applying a first source material beam at a first angle relative to a top surface of the substrate; and
applying a second source material beam at a second angle relative to the top surface of the substrate,
a distance between the first nucleus and the first dielectric pillar is less than a distance between the first nucleus and the second dielectric pillar;
rotating the substrate while continuing to apply the first source material beam and the second source material beam to form a first semiconductor column from the first nucleus; and
forming a gate electrode around the first semiconductor column.

14. The method of claim 12, comprising:
forming a first insulating layer over the first nucleus and around the first semiconductor column;
forming a doped material layer over the first insulating layer and around the first semiconductor column; and
forming a gate dielectric layer over the doped material layer and around the first semiconductor column.

15. The method of claim 14, wherein the gate electrode is formed over the gate dielectric layer and spaced apart from the first semiconductor column by the gate dielectric layer.

16. The method of claim 14, comprising:
forming a second insulating layer over the gate dielectric layer, the second insulating layer in contact with the gate dielectric layer and the gate electrode.

17. The method of claim 14, wherein the doped material layer is in contact with a top surface and a sidewall of the first insulating layer.

18. The method of claim 12, comprising:
forming a doped material layer over an edge of the first semiconductor column that is diametrically opposite to an edge of the first semiconductor column that contacts the first nucleus.

19. The method of claim 12, comprising:
forming a first insulating layer over the first nucleus and around the first semiconductor column, the first insulating layer concealing the first semiconductor column; and etching the first insulating layer to expose a sidewall of the first semiconductor column.

20. The method of claim 12, wherein the first nucleus is formed with a tapered sidewall and the first semiconductor column protrudes from the tapered sidewall of the first nucleus.

* * * * *

UNITED STATES PATENT AND TRADEMARK OFFICE
CERTIFICATE OF CORRECTION

PATENT NO.       : 9,773,889 B2
APPLICATION NO.  : 14/334827
DATED            : September 26, 2017
INVENTOR(S)      : Wei-Chieh Chen et al.

It is certified that error appears in the above-identified patent and that said Letters Patent is hereby corrected as shown below:

Column 14, Line 41, please delete "12" and insert therefor --13--.

Signed and Sealed this
Fifteenth Day of May, 2018

Andrei Iancu
*Director of the United States Patent and Trademark Office*